US006770982B1

(12) United States Patent
Liou

(10) Patent No.: US 6,770,982 B1
(45) Date of Patent: Aug. 3, 2004

(54) SEMICONDUCTOR DEVICE POWER DISTRIBUTION SYSTEM AND METHOD

(75) Inventor: Shiann-Ming Liou, Campbell, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 10/051,965

(22) Filed: Jan. 16, 2002

(51) Int. Cl.[7] ............................................. H01L 23/48
(52) U.S. Cl. ..................... 257/784; 257/779; 257/690
(58) Field of Search ............................... 257/784, 779, 257/690

(56) References Cited

U.S. PATENT DOCUMENTS

| 4,359,754 A | 11/1982 | Hayakawa et al. |
| 4,403,240 A | 9/1983 | Seki et al. |
| 5,384,487 A | 1/1995 | Rstker et al. |
| 5,495,398 A | * 2/1996 | Takiar et al. ............... 361/790 |
| 5,838,072 A | 11/1998 | Li et al. |
| 5,869,870 A | 2/1999 | Lin |
| 5,905,639 A | 5/1999 | Warren |
| 5,960,262 A | 9/1999 | Torres et al. |
| 5,986,345 A | 11/1999 | Monnot |
| 5,989,939 A | * 11/1999 | Fjelstad ...................... 438/117 |
| 6,025,616 A | 2/2000 | Nguyen et al. |
| 6,043,539 A | 3/2000 | Sigasawara |
| 6,091,140 A | 7/2000 | Toh et al. |
| 6,097,098 A | 8/2000 | Ball |
| 6,107,681 A | 8/2000 | Lin |
| 6,144,093 A | 11/2000 | Davis et al. |
| 6,169,331 B1 | * 1/2001 | Manning et al. ............ 257/784 |
| 6,211,565 B1 | 4/2001 | Yu |
| 6,246,113 B1 | 6/2001 | Lin |
| 6,348,400 B1 | * 2/2002 | Schoenfeld ................. 438/617 |

* cited by examiner

Primary Examiner—Luan Thai
(74) Attorney, Agent, or Firm—Marvell Semiconductor, Inc.

(57) ABSTRACT

An integrated circuit power distribution system and method is provided. The integrated circuit comprises a semiconductor die that includes at least one pair of bond pads having a single bond wire connected thereto such that each bond pad of the pair of bond pads has only one bond wire end connected thereto. A first bond pad of the pair of bond pads is located in an internal portion of the semiconductor die. A first wire having a first end and a second end is electrically connected between the pair of bond pads.

32 Claims, 2 Drawing Sheets

SEMICONDUCTOR DEVICE POWER DISTRIBUTION SYSTEM AND METHOD

TECHNICAL FIELD

This invention relates to power and signal distribution in semiconductor dies.

BACKGROUND

Many conventional semiconductors are mounted in packages such as Quad Flat Packs (QFPs) and Pin Ball Gate Arrays (PBGAs) in which the input and output terminals are arranged along the edge of the die. Arranging the terminals along the die edge may result in relatively long wirings on silicon to supply power and ground to the center of the die. These long wirings generally have a relatively high resistance leading to unacceptable IR voltage drops.

SUMMARY OF THE INVENTION

An integrated circuit power distribution system and method is provided. The integrated circuit comprises a semiconductor die that includes at least one pair of bond pads having a single bond wire connected thereto such that each bond pad of the pair of bond pads has only one bond wire end connected thereto. A first bond pad of the pair of bond pads is located in an internal portion of the semiconductor die. A first wire having a first end and a second end is electrically connected between the pair of bond pads.

DESCRIPTION OF DRAWINGS

Like reference symbols in the various drawings indicate like elements.

DETAILED DESCRIPTION

Figure 1:
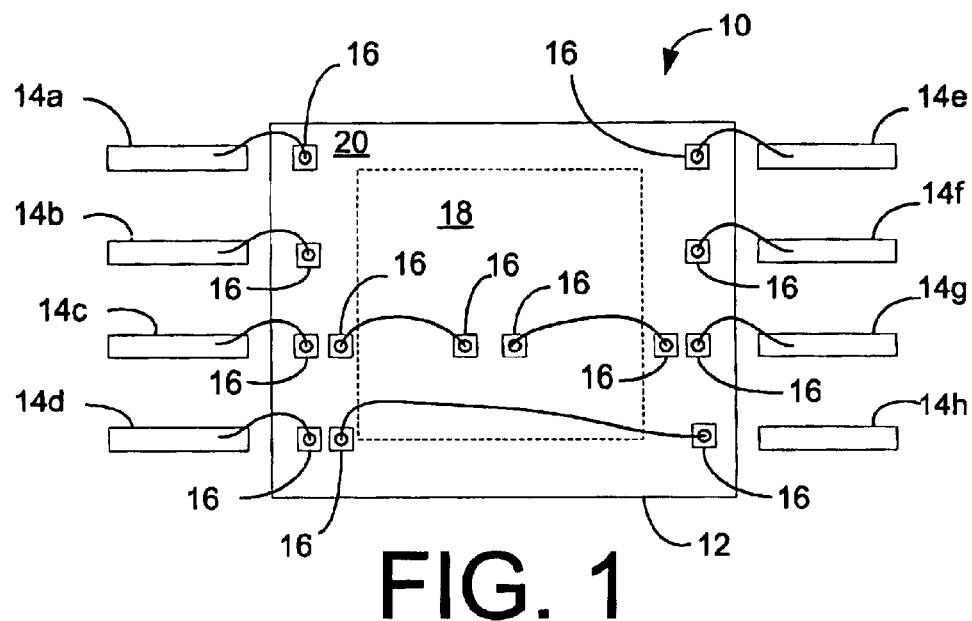
FIG. 1 is a two-dimensional top-view of a semiconductor device.

FIG. 1 shows a top-view of a semiconductor power distribution system and method. A semiconductor device 10 includes a semiconductor die 12 and several lead fingers 14a–14h. The semiconductor device 10 may be mounted in any suitable package such as QFPs and PBGAs.

The semiconductor die 12 includes bonding surfaces 16 arranged in an interior portion 18 of the semiconductor die 12 as well as along an outer periphery 20 of the semiconductor die 12. The bonding surfaces 16 are preferably bonding pads connected to traces in the semiconductor die 12. The bonding surfaces 16 provide connection points for lead wires 22 extending to other bonding surfaces 16 or lead fingers 14. Employing a lead wire 22 within the interior portion 18 may advantageously reduce the voltage drop caused by IR losses in a trace. In addition, a lead wire 22 may be used in place of a trace to reduce the density of traces within the semiconductor die 12. Using a lead wire 22 to couple electrical signals to internal portions of the semiconductor die 12 may be particularly advantageous in high density semiconductors where using wide low resistance traces to carry the signal would require additional layers. In one example, a lead wire 22 may be connected in parallel with a trace in the semiconductor die 18 to reduce the combined resistance, thereby decreasing the voltage drop associated with the trace. In a second example, a lead wire 22 may be used in lieu of using a trace within the semiconductor die 18. In a third example, a lead wire may be connected from a bonding surface 16 located along one edge of the semiconductor periphery 20 to another bonding surface 16 located along another edge of the semiconductor periphery 20.

The lead wires 22 are bonded to different ones of the bonding surfaces 16 and/or lead finger 14 to provide low resistance connections for electrical signals such as power, ground, and signals. The lead wires 14 may comprise an electrically conductive material such as gold, aluminum, and copper that has a low electrical resistance. Each of the lead fingers 14 may be coupled to a bonding surface or remain as a non-connected lead finger 14h. Any wire bonding method such as thermocompression and ultrasonic may be used to bond the lead wires 14 to the bonding surfaces 16 and lead fingers 14.

The lead wires 22 may be bonded using any wire bond type such as ball bond, stitch bond on bonding pad, and stitch bond on ball. A ball bond may be formed by first forming a sphere at the end of a lead wire. Then, the sphere is pressed against a bonding surface for a few seconds to form a weld. A stitch bond on bonding pad may be formed by placing the tail of a lead parallel to a bonding surface. Then, pressure is applied to the lead wire forcing the lead wire onto the bonding pad. A stitch bond on ball may be formed in similar manner to forming a stitch bond on bonding pad, except a ball is first formed on the bonding surface.

Figure 2:
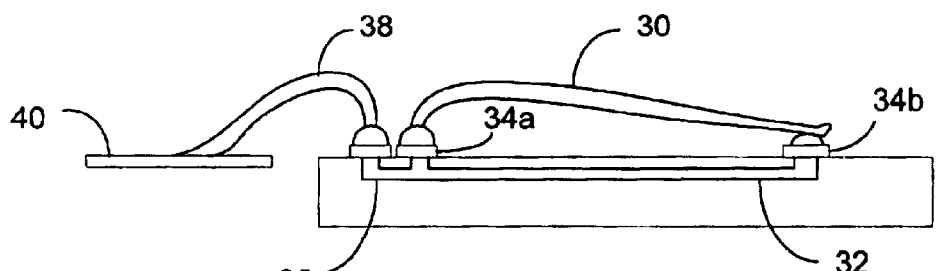
FIG. 2 is a two-dimensional side-view of a semiconductor device.

FIG. 2 shows another aspect of the semiconductor power distribution system. A lead wire 30 is connected in parallel with a trace 32 to reduce the electrical resistance of a connection between two bonding surfaces 34a and 34b. The lead wire 30 may be connected via a trace 36 to another lead wire 38 that is connected to a lead finger 40. The lead wire 30 reduces the voltage losses associated with the electrical resistance of the trace 32 by providing a parallel path for current.

Figure 3:
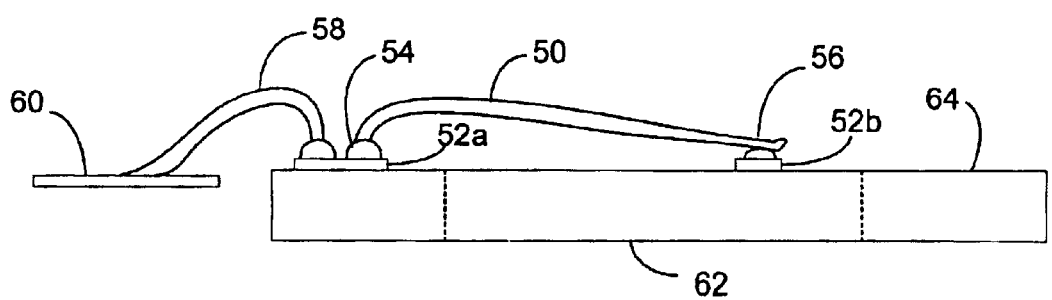
FIG. 3 is a two-dimensional side-view of a semiconductor device.

FIG. 3 shows another aspect of the semiconductor power distribution system and method. A lead wire 50 is connected between two bonding surfaces 52a and 52b. The bonding surface 52b is preferably located within an interior portion 62 of a semiconductor die 64. The lead wire 50 is used in lieu of a trace to carry electrical signals between the bonding surfaces 52a and 52b. The lead wire 50 may be coupled to the bonding surfaces 52a and 52b via a ball bond 54 and a stitch bond on ball 56 respectively. Another lead wire 58 may connect the bonding surface 52a to a lead finger 60 so that signals may be coupled between the lead finger 60 and the interior portion 62 of the semiconductor die 64 without traversing within the semiconductor die 64.

Figure 4:
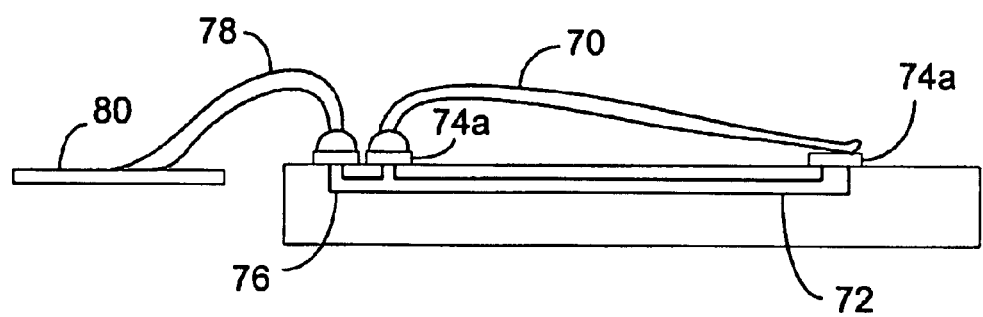
FIG. 4 is a two-dimensional side-view of a semiconductor device.

FIG. 4 shows another aspect of the semiconductor power distribution system and method similar to that shown in FIG. 2 in function with corresponding elements numbered in the range 70 to 80, except that the lead wire 70 is connected at bonding surface 74b with a stitch on pad type of bond.

A number of embodiments of the invention have been described. Nevertheless, it will be understood that various modifications may be made without departing from the spirit and scope of the invention. Accordingly, other embodiments are within the scope of the following claims.

What is claimed is:

1. An integrated circuit, comprising:
    a semiconductor die including at least one pair of bond pads and an input/output (I/O) bond pad, each pair of bond pads having a single corresponding bond wire connected thereto such that each bond pad of each of the at least one pair of bond pads has only one bond wire end connected thereto, a first bond pad of the at least one pair of bond pads located in an internal portion of the semiconductor die, the I/O bond pad to receive an I/O bond wire operable for electrically connecting to a package.

2. The integrated circuit of claim 1 wherein the at least one pair of bond pads includes a second bond pad located along a periphery of the semiconductor die.

3. The integrated circuit of claim 1 wherein the single corresponding bond wire comprises a metallic material selected from the group consisting of gold, aluminum, and copper.

4. The integrated circuit of claim 1 wherein the single corresponding bond wire is bonded to the pair of bond pads using a wire bond type selected from the group consisting of ball bonds, stitch bonds, stitch bonds on bonding pad, and stitch bonds on ball.

5. The integrated circuit of claim 1 further comprising a first trace in the semiconductor die connected between the pair of bond pads.

6. The integrated circuit of claim 1 wherein the at least one pair of bond pads includes a second bond pad located in a non-internal portion of the semiconductor die.

7. The integrated circuit of claim 1 wherein the single corresponding bond wire is selected from the group consisting of power interconnects, ground interconnects, and signal interconnects.

8. The integrated circuit of claim 1 further comprising a plurality of pairs of bond pads, each of the pairs of bond pads having a corresponding wire connected therebetween such that each bond pad of the pairs of bond pads includes a single wire bond.

9. The integrated circuit of claim 1 further comprising a second trace in the semiconductor die connected between the I/O bond pad and one of the pair of bond pads.

10. The integrated circuit of claim 1 included in the package, the package including a lead finger; and
the I/O bond wire to connect between the I/O bond pad and the lead finger.

11. An integrated circuit, comprising:
a semiconductor die including at least one pair of electrical termination means and an input/output (I/O) electrical termination means, each pair of electrical termination means having a single corresponding means for conducting connected thereto such that each electrical termination means of the pair of electrical termination means has only one end of any means for conducting connected thereto, a first electrical termination means of each of the at least one pair of electrical termination means located in an internal portion of the semiconductor die, the I/O electrical termination means to receive an I/O means for conducting operable for electrically connecting to a package.

12. The integrated circuit of claim 11 wherein the at least one pair of electrical termination means includes a second electrical termination means located along a periphery of the semiconductor die.

13. The integrated circuit of claim 11 wherein the single corresponding means for conducting comprises a metallic material selected from the group consisting of gold, aluminum, and copper.

14. The integrated circuit of claim 11 wherein the single corresponding means for conducting is bonded to the pair of electrical termination means using a wire bond type selected from the group consisting of ball bonds, stitch bonds, stitch bonds on bonding pad, and stitch bonds on ball.

15. The integrated circuit of claim 11 further comprising a first trace in the semiconductor die connected between the pair of electrical termination means.

16. The integrated circuit of claim 11 wherein the at least one pair of electrical termination means includes a second electrical termination means located in a non-internal portion of the semiconductor die.

17. The integrated circuit of claim 11 wherein the single corresponding means for conducting is selected from the group consisting of power interconnects, ground interconnects, and signal interconnects.

18. The integrated circuit of claim 11 further comprising a plurality of pairs of electrical termination means, each of the pairs of electrical termination means having a corresponding means for conducting connected therebetween such that each electrical termination means of the pairs of electrical termination means includes a single wire bond.

19. The integrated circuit of claim 11 further comprising a second trace in the semiconductor die connected between the I/O electrical termination means and one of the pair of electrical termination means.

20. The integrated circuit of claim 11 included in the package, the package including a means for connecting; and
the I/O conducting means to connect between the I/O electrical termination means and the connecting means.

21. An integrated circuit, comprising:
a semiconductor die including at least one pair of bond pads, a first bond pad of the at least one pair of bond pads located in an internal portion of the semiconductor die and having a first end of a first bond wire connected thereto, the first bond pad having only one bond wire connected thereto, a second bond pad of the at least one pair of bond pads located in a periphery of the semiconductor die and having a first portion and a second portion, the first portion of the second bond pad having a second end of the first bond wire connected thereto, the second portion of the second bond pad to receive an I/O bond wire for electrically connecting to leads of a package, wherein the leads are spaced from a periphery of the semiconductor die.

22. The integrated circuit of claim 21 wherein the first bond wire comprises a metallic material selected from the group consisting of gold, aluminum, and copper.

23. The integrated circuit of claim 21 wherein the first bond wire is bonded to the pair of bond pads using a wire bond type selected from the group consisting of ball bonds, stitch bonds, stitch bonds on bonding pad, and stitch bonds on ball.

24. The integrated circuit of claim 21 further comprising a first trace in the semiconductor die connected between the pair of bond pads.

25. The integrated circuit of claim 21 wherein the first bond wire is selected from the group consisting of power interconnects, ground interconnects, and signal interconnects.

26. The integrated circuit of claim 21 further comprising a plurality of pairs of bond pads, each of the pairs of bond pads having a corresponding wire connected therebetween.

27. An integrated circuit, comprising:
a semiconductor die including at least one pair of electrical termination means, a first electrical termination means of the at least one pair of electrical termination means located in an internal portion of the semiconductor die and having a first end of a first means for conducting connected thereto, the first electrical termination means having only one conducting means connected thereto, a second electrical termination means of the at least one pair of electrical termination means located in a periphery of the semiconductor die and having a first portion and a second portion, the first portion of the second electrical termination means having a second end of the first conducting means connected thereto, the second portion of the second electrical termination means to receive an I/O conducting means for electrically connecting to leads of a package, wherein the leads are spaced from a periphery of the semiconductor die.

28. The integrated circuit of claim 27 wherein the first conducting means comprises a metallic material selected from the group consisting of gold, aluminum, and copper.

29. The integrated circuit of claim 27 wherein the first conducting means for conducting is bonded to the pair of electrical termination means using a wire bond type selected from the group consisting of ball bonds, stitch bonds, stitch bonds on bonding pad, and stitch bonds on ball.

30. The integrated circuit of claim 27 further comprising a first trace in the semiconductor die connected between the pair of electrical termination means.

31. The integrated circuit of claim 27 wherein the first conducting means is selected from the group consisting of power interconnects, ground interconnects, and signal interconnects.

32. The integrated circuit of claim 27 further comprising a plurality of pairs of electrical termination means, each of the pairs of electrical termination means having a corresponding means for conducting connected therebetween.

* * * * *